(12) United States Patent
Hoffman et al.

(10) Patent No.: US 9,589,767 B2
(45) Date of Patent: Mar. 7, 2017

(54) SYSTEMS, METHODS, AND APPARATUS FOR MINIMIZING CROSS COUPLED WAFER SURFACE POTENTIALS

(71) Applicant: Advanced Energy Industries, Inc., Fort Collins, CO (US)

(72) Inventors: Daniel J. Hoffman, Fort Collins, CO (US); Victor Brouk, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 230 days.

(21) Appl. No.: 14/334,866

(22) Filed: Jul. 18, 2014

(65) Prior Publication Data

US 2015/0024515 A1    Jan. 22, 2015

Related U.S. Application Data

(60) Provisional application No. 61/856,485, filed on Jul. 19, 2013.

(51) Int. Cl.
*H01J 37/32* (2006.01)

(52) U.S. Cl.
CPC .. *H01J 37/32082* (2013.01); *H01J 37/32174* (2013.01); *H01J 37/32706* (2013.01)

(58) Field of Classification Search
USPC ........................... 315/111.21, 111.41, 111.71
See application file for complete search history.

(56) References Cited

U.S. PATENT DOCUMENTS

| | | |
|---|---|---|
| 2002/0149445 A1 | 10/2002 | Chawla et al. |
| 2006/0091878 A1 | 5/2006 | Wilson et al. |
| 2009/0078375 A1* | 3/2009 | Nishio ............... C23C 16/4404 |
| | | 156/345.33 |

OTHER PUBLICATIONS

Menon, Vinod, "International Search Report and Written Opinion re Application No. PCT/US2014/047162", Oct. 2, 2014, p. 10 Published in: AU.

Mohri, Mineko, "International Preliminary Report on Patentability re Application No. PCT/US2014/047162", Jan. 28, 2016, Published in: EP.

* cited by examiner

*Primary Examiner* — Douglas W Owens
*Assistant Examiner* — Jianzi Chen
(74) *Attorney, Agent, or Firm* — Neugeboren O'Dowd PC

(57) ABSTRACT

This disclosure describes systems, methods, and apparatus for reducing a DC bias on a substrate surface in a plasma processing chamber due to cross coupling of RF power to an electrode coupled to the substrate. This is brought about via tuning of a resonant circuit coupled between the substrate and ground based on indirect measurements of harmonics of the RF field level at a surface of the substrate. The resulting reduction in DC bias allows a lower ion energy than possible without this resonant circuit and tuning thereof.

20 Claims, 7 Drawing Sheets

SYSTEMS, METHODS, AND APPARATUS FOR MINIMIZING CROSS COUPLED WAFER SURFACE POTENTIALS

CLAIM OF PRIORITY UNDER 35 U.S.C. §119

The present Application for Patent claims priority to Provisional Application No. 61/856,485 entitled "SYSTEMS, METHODS, AND APPARATUS FOR MINIMIZING CROSS COUPLED WAFER SURFACE POTENTIALS" filed Jul. 19, 2013, and assigned to the assignee hereof and hereby expressly incorporated by reference herein.

FIELD OF THE DISCLOSURE

The present disclosure relates generally to wafer processing. In particular, but not by way of limitation, the present disclosure relates to systems, methods and apparatuses for reducing a cross coupled potential on a wafer surface.

BACKGROUND

Semiconductors are commonly formed in a plasma processing chamber where etching and deposition are enhanced by plasma generated ions that bombard the wafer substrate. The plasma can be ignited and sustained via radio frequency (RF) power from an RF source inductively or capacitively coupled into the plasma via application of the RF between a first electrode and a ground (e.g., the chamber walls). A wafer or substrate to be processed can rest atop or be coupled to a second electrode (optionally biased or grounded) for processes that include wafer cleaning, ion implantation, etching, coating or substrate modification, and ion-enhanced deposition, to name a few. For reactive ion etching (RIE) the substrate can be coupled to the first electrode. A frequency and magnitude of the RF source can influence plasma density, which is one 'knob' in many semiconductor processing recipes since plasma density influences a number and rate of ions that impact the substrate, and hence influence cleaning, etching, etc.

A sheath voltage is another 'knob' that can be used to control ion energy in many recipes. A sheath or dark space exists between the plasma and any solid surface, such as the substrate or the chamber walls. The sheath is largely devoid of electrons as these get accelerated into the plasma, and thus a voltage difference, between the plasma and any solid surface, across the sheath exists, which accelerates ions that enter the sheath and causes the ions to bombard any solid surface on an opposite side of the sheath from the plasma. Thus, the sheath potential, or potential difference between the plasma and the substrate, controls an ion bombardment energy or ion energy. Ion energy influences how much energy each incoming ion transfers to the substrate upon impact, which can influence a rate of etching as well as an etching profile (a profile of the feature etched into the substrate).

While the second electrode can be grounded, in some instances, a DC bias is applied to the second electrode in order to control the ion energy. However, because of cross coupling of the RF to the second electrode, it is typically difficult to control ion energy independent of the plasma density. In other words, the RF source produces some DC bias on the substrate via RF cross coupling and this DC bias affects a minimum ion energy even where no intentional DC bias is applied to the second electrode.

Yet, some processes call for an ion energy that is lower than this minimum. One solution is to include an LC resonant circuit between the second electrode and the DC bias that is tuned to dampen and reduce the RF cross coupling. For instance, including a variable capacitor between the second electrode and the DC bias can create an inherent series LC resonant circuit due to inherent inductances in the wires and circuitry. Theoretically, tuning the variable capacitor such that a minimum of the LC resonant circuit is achieved can minimize the cross coupled RF field at the substrate, which results in a lower DC bias, and in turn enables lower minimum ion energies.

However, tuning of such LC resonant circuits has not produced the expected reductions in the cross coupled RF field, such systems are highly unstable, and real-time tuning is not possible.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure solve the aforementioned challenges by ascertaining a real-time estimate of a DC voltage in the plasma sheath and hence the voltage controlling ion energy. Direct or contact measurements are difficult if not impossible and indirect measurements at the fundamental frequency of the RF power, for instance with an RF antenna, give a voltage versus frequency plot that does not align with the minimum ion energy. However, harmonics of the fundamental do align with a plot of the minimum wafer surface voltage and hence ion energy. Thus, by indirectly monitoring harmonics of the RF power coupling into the substrate and through the sheath, one can tune a resonant circuit coupled to the substrate electrode and minimize a sheath voltage and hence ion energy below the minimum otherwise possible due to cross-coupled RF.

Some embodiments of the disclosure may be characterized as a system for reducing a DC voltage on a substrate of a plasma processing chamber below a minimum otherwise established by cross-coupling from an RF power source. The system can include an RF field level sensor, a harmonics filter, a first tunable resonant circuit, a surface voltage minimum tracker, and a controller circuit. The RF field level sensor can be arranged adjacent to, but not touching, a substrate being processed in the plasma processing chamber. The harmonics filter can be configured to: couple to one or more RF power sources for a plasma processing chamber; receive a primary RF frequency from the one or more RF power sources; receive RF field level measurements from the RF field level sensor; and preclude the passage of measurements of at least the primary RF frequency. The first tunable resonant circuit can be configured to couple between the substrate and ground. The surface voltage minimum tracker can couple to the harmonics filter and can be configured to: receive measurements from the harmonics filter other than those of at least the primary RF frequency; and determine whether the first resonant circuit is to be tuned to a higher or lower resonant frequency in order to minimize the measurements from the harmonics filter. Lastly, the controller circuit can be coupled between the surface voltage minimum tracker and the first resonant circuit and can be configured to generate one or more control signals to increase or decrease a first resonant frequency of the first resonant circuit based on instructions from the surface voltage minimum tracker.

Other embodiments of the disclosure may also be characterized as a system for minimizing RF cross-coupling to a substrate in a dual-electrode plasma processing chamber. The system can include a plasma processing chamber, a first electrode, a second electrode, an RF source, a substrate, an RF field level sensor, a first tunable resonant circuit, and a controller. The RF source can couple to the first electrode and can provide RF power to the first electrode at a first frequency. The RF power can ignite and sustain a plasma in the processing chamber. The substrate can coupled to the second electrode and can have a DC surface voltage, where a minimum of the DC surface voltage is limited by cross coupling of the RF power to the substrate. The RF field level sensor inside the plasma processing chamber can measure an RF field level near the substrate and pass measurements of the RF field to a controller. The first tunable resonant circuit can couple between the second electrode and ground. The controller can couple to the RF field level sensor and the first tunable resonant circuit. The controller can further tune the first tunable resonant circuit based on the measurements of the RF field filtered at one or more harmonics of the first frequency so as to minimize the cross coupling of the RF power to the substrate.

Other embodiments of the disclosure can be characterized as a method for minimizing an ion energy floor created by parasitic coupling of RF power from an RF source electrode into an electrode that a substrate is coupled to. The method can include monitoring an RF field level at a surface of a substrate without touching the surface, for instance with an RF antenna. The measurements of the RF field level at the surface of the substrate can then be filtered for one or more harmonics of a primary or fundamental frequency at which RF power is coupled into a plasma processing chamber encompassing the substrate. The method also includes adjusting a resonant frequency of a first resonant circuit coupled between the substrate and ground in order to minimize the one or more harmonics.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying

DRAWINGS

Figure 1:
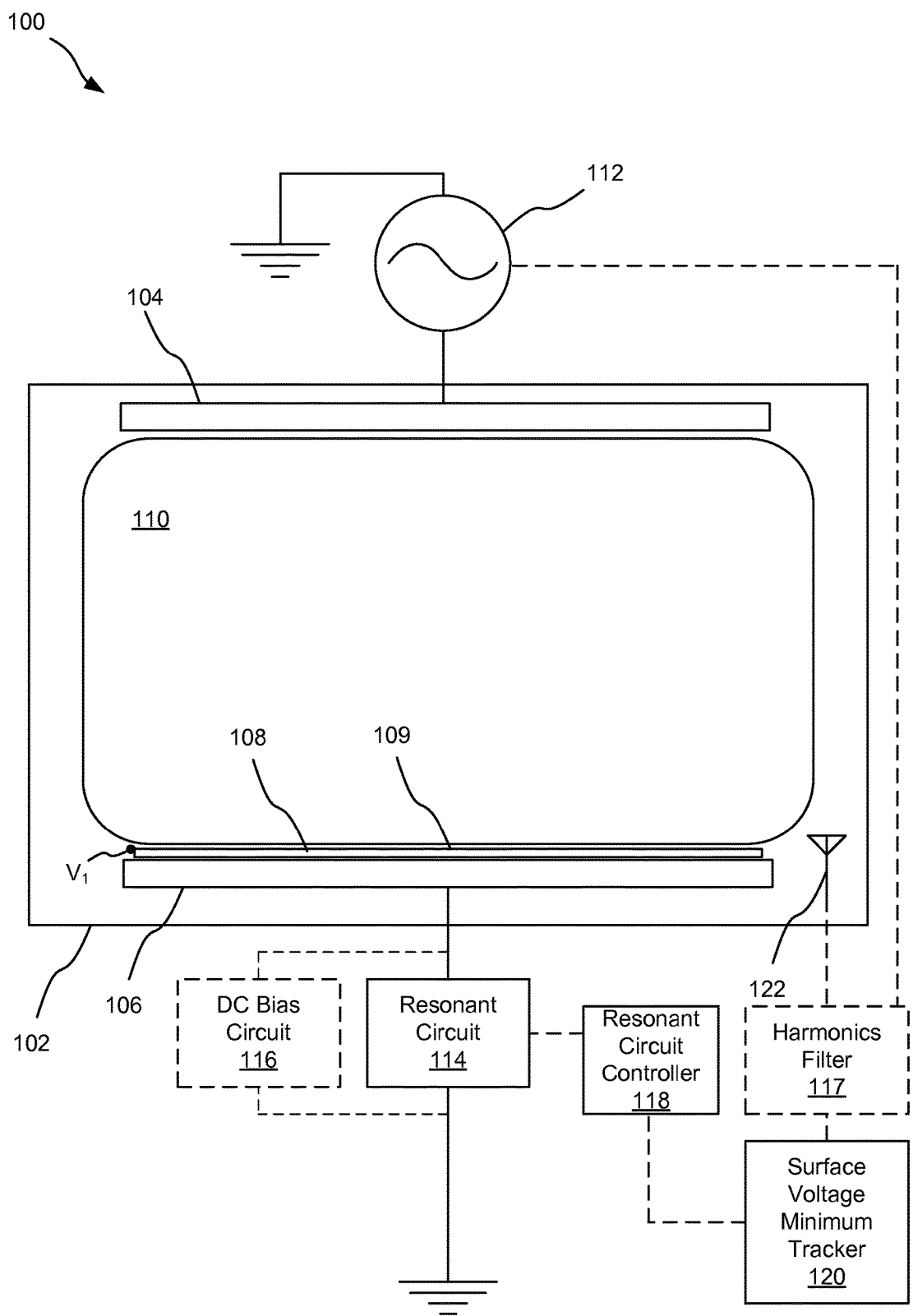
Figure 2:
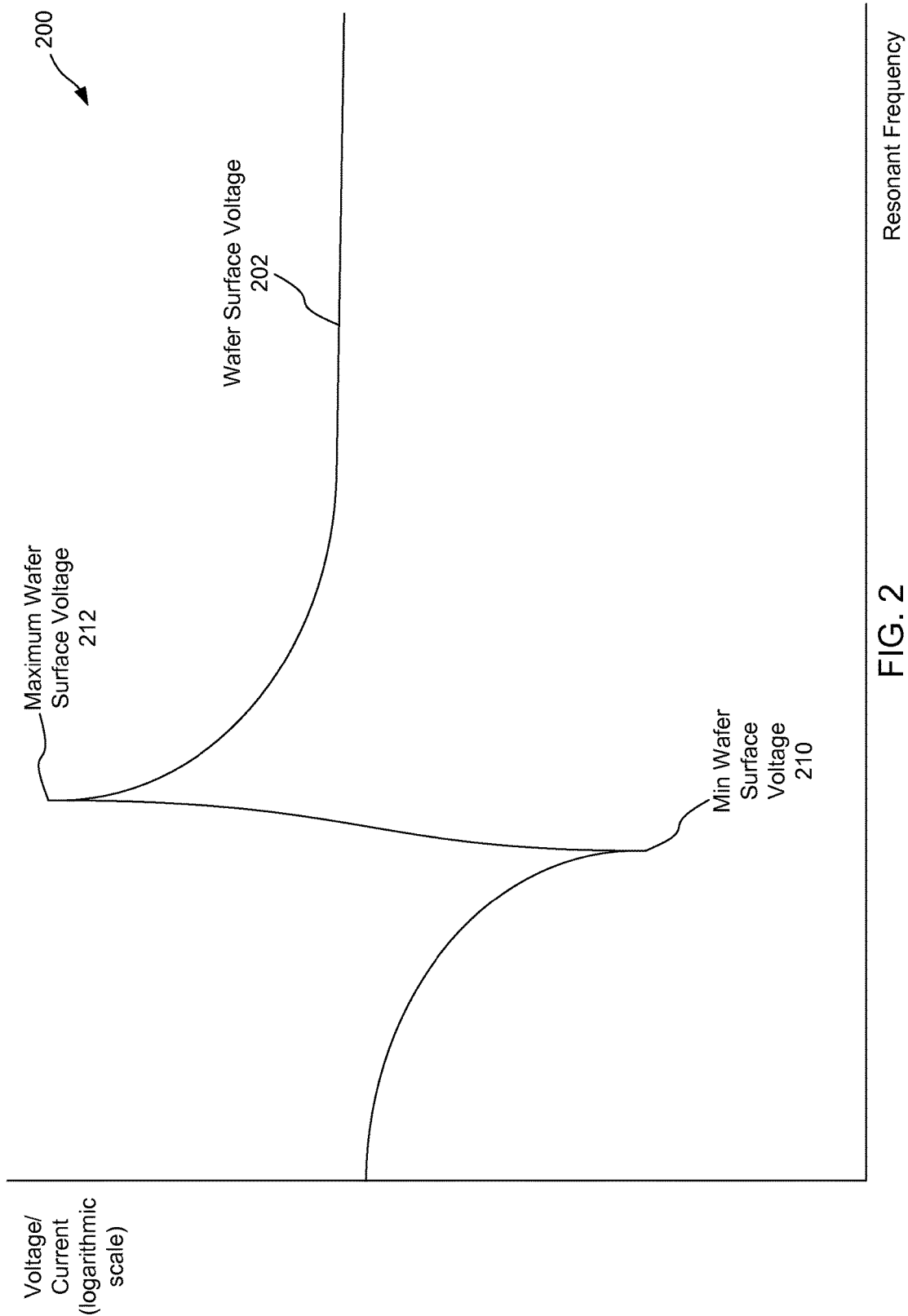
Figure 3:
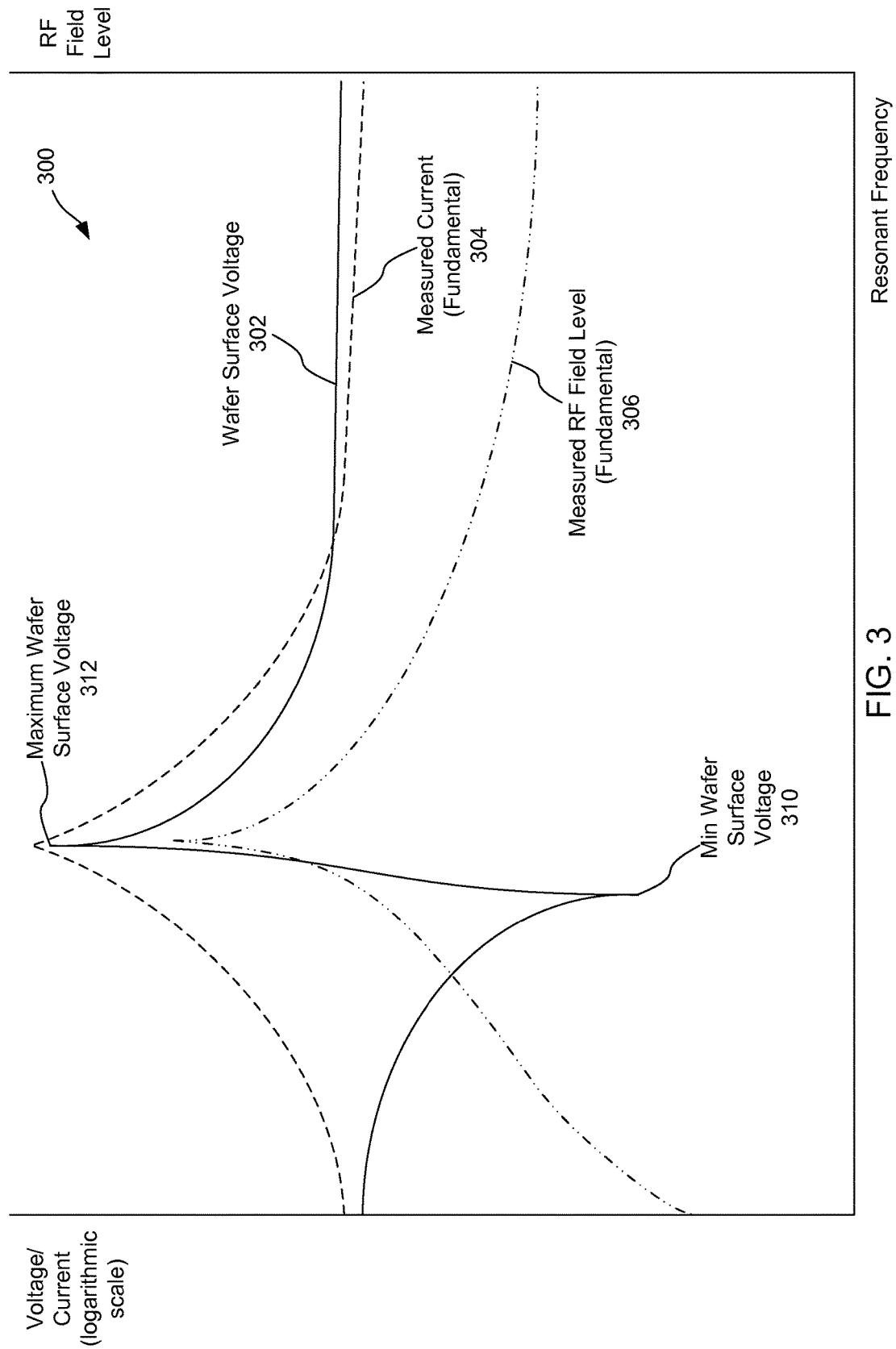
Figure 4:
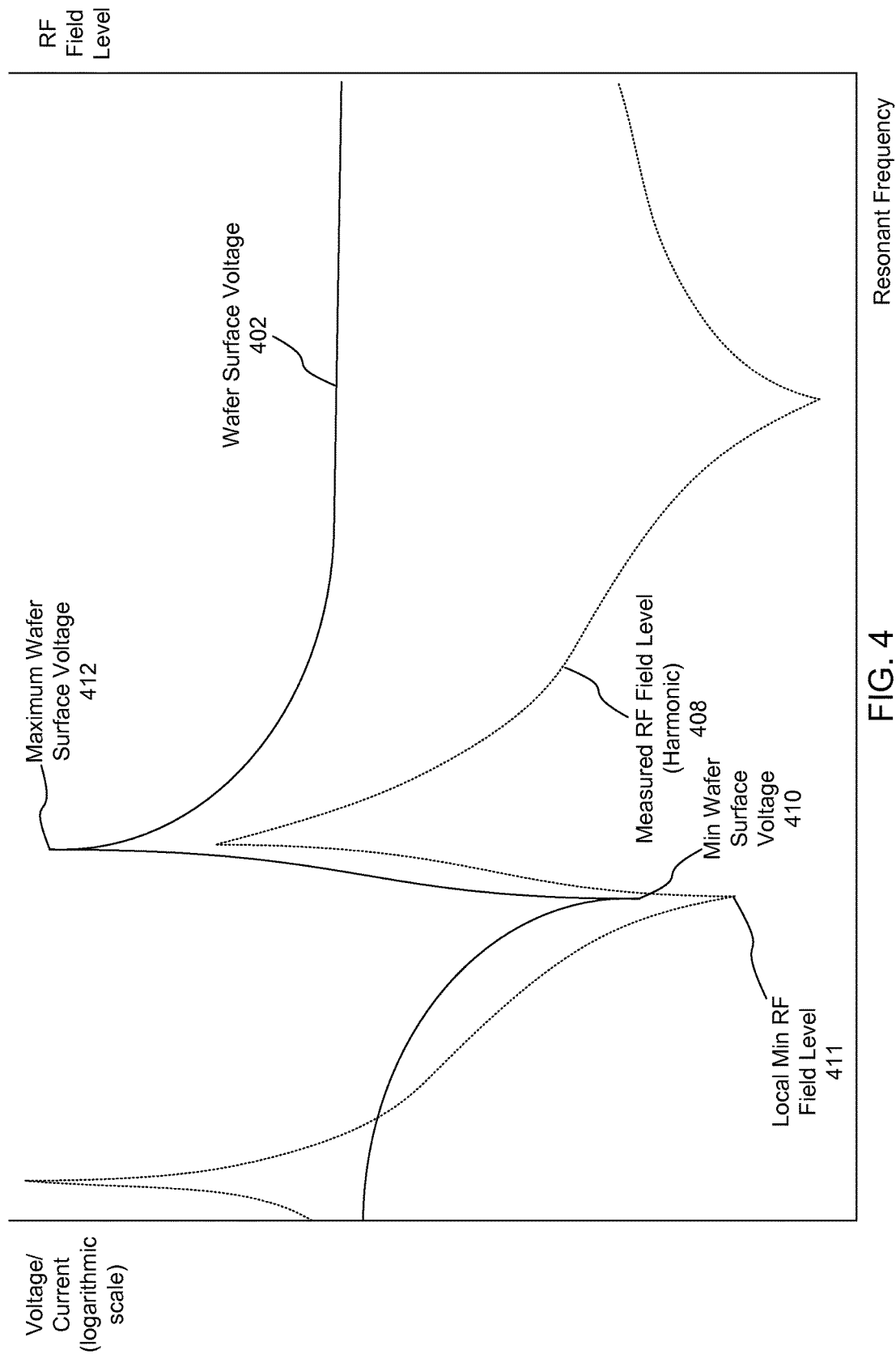
Figure 5:
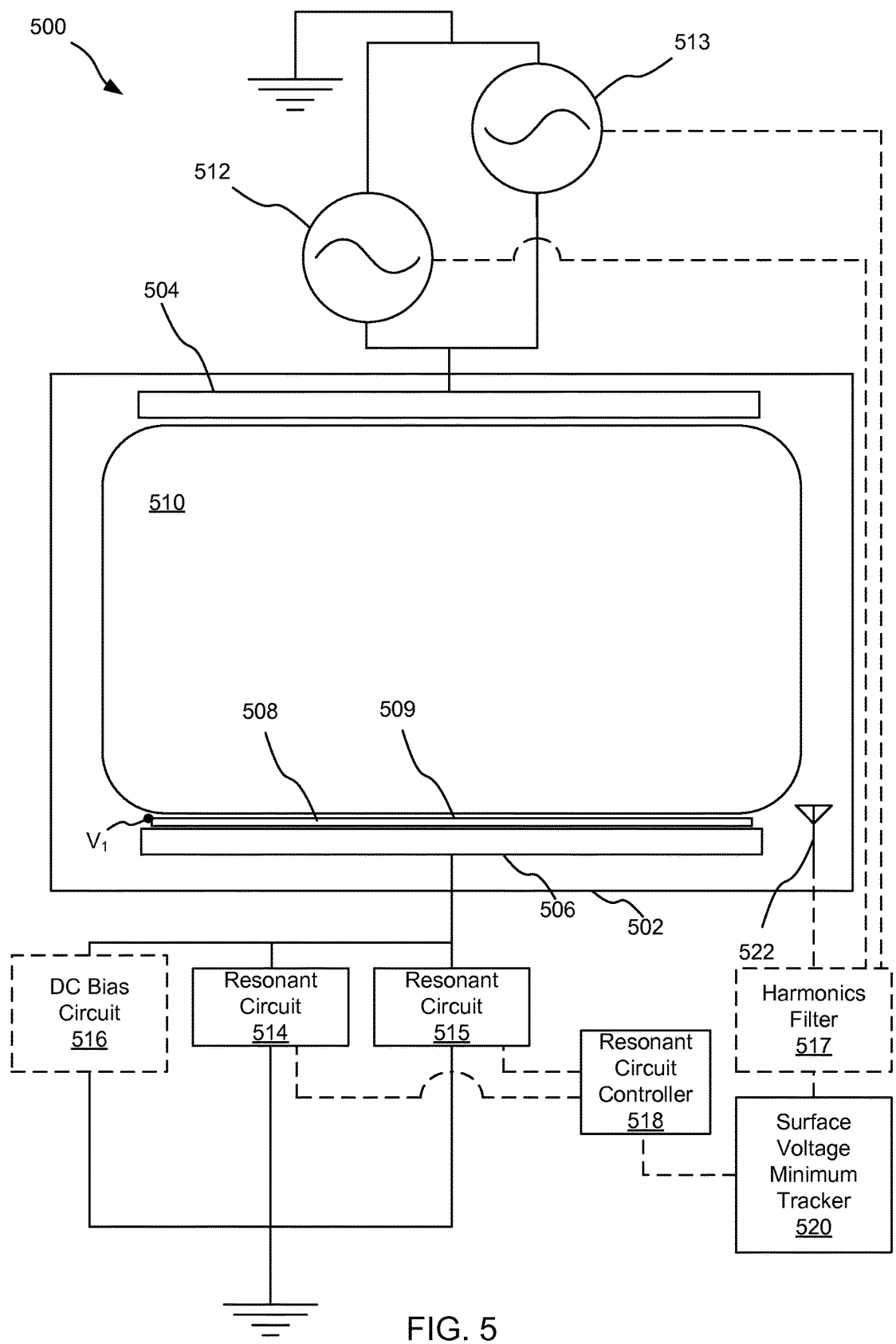
Figure 6:
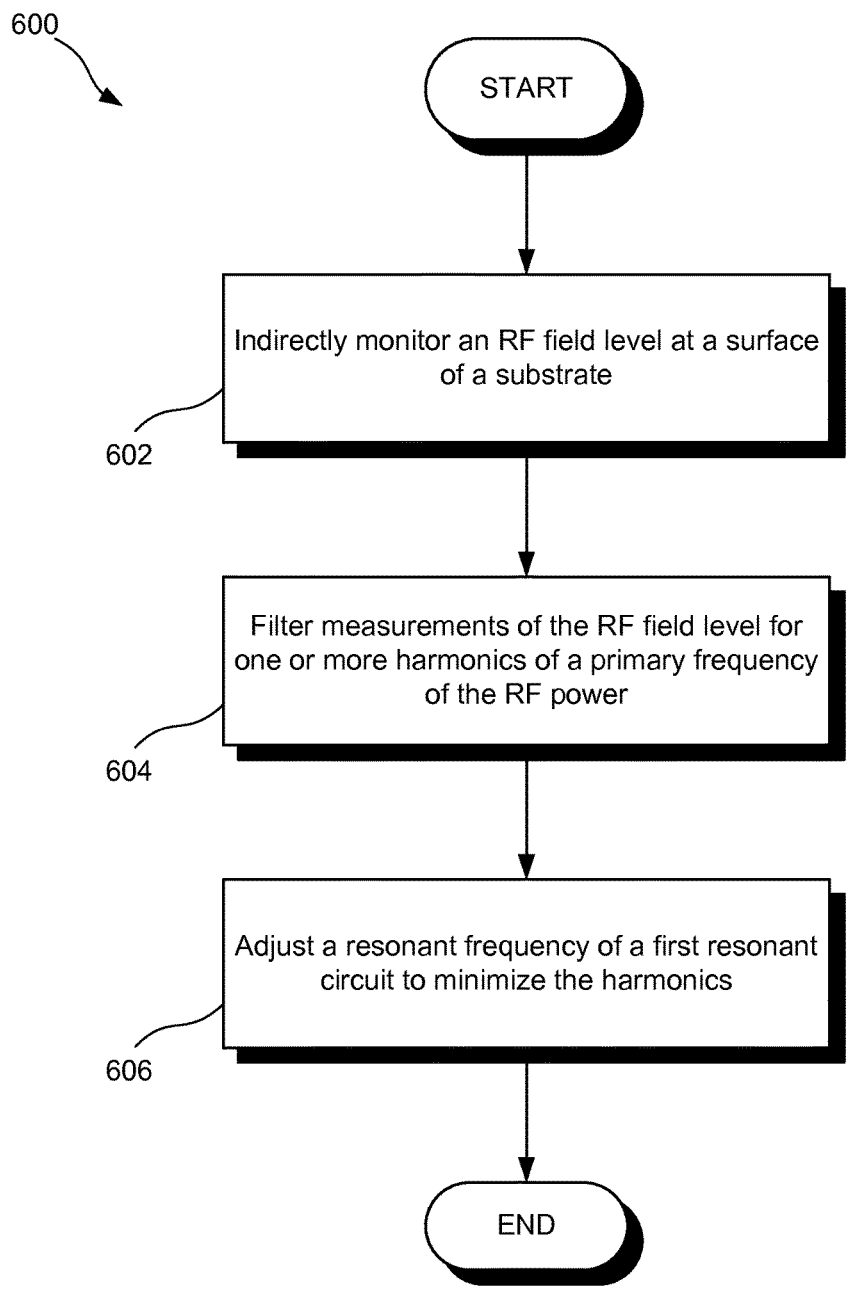
Figure 7:
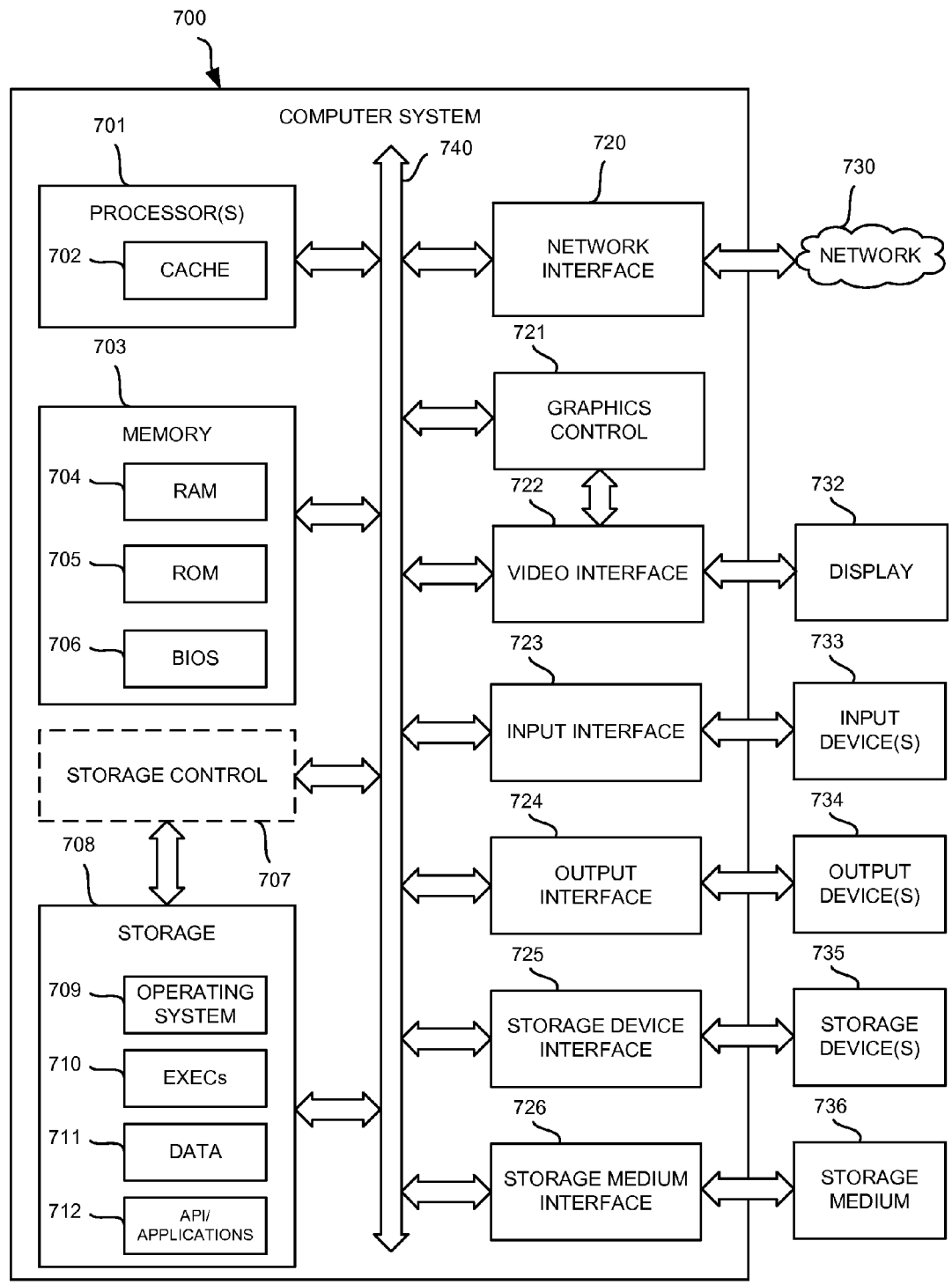

FIG. 1 illustrates one embodiment of a plasma processing system able to reduce a DC bias on a substrate surface below a minimum otherwise set by RF coupling to the substrate;

FIG. 2 illustrates a wafer surface voltage versus resonant circuit capacitance;

FIG. 3 illustrates a modeled wafer surface voltage and an RF field level measured by an RF field level sensor;

FIG. 4 illustrates a modeled wafer surface voltage and a measured RF field level measured by the RF field level sensor and filtered for a harmonic of the RF source;

FIG. 5 illustrates an embodiment of a plasma processing system operating at multiple frequencies;

FIG. 6 illustrates a method of minimizing an ion energy floor created by parasitic coupling of RF power from an RF source electrode into an electrode that the substrate is coupled to; and FIG. 7 shows a diagrammatic representation of one embodiment of a computer system within which a set of instructions can execute for causing a device to perform or execute any one or more of the aspects and/or methodologies of the present disclosure.

DETAILED DESCRIPTION

In solving these challenges, the first realization that the inventors made was that, while a typical series LC resonant circuit has a single resonance (e.g., a single null), the series LC resonant circuit used in this context has two resonances, likely caused by stray capacitance and inductance. Modeling then indicated that the resonances were much closer to each other than expected.

FIG. 2 illustrates a wafer surface voltage plot based on such modeling. The wafer surface voltage 202 is plotted as a function of a capacitance in the series LC resonant circuit (or any other resonant circuit). The wafer surface voltage 202 has a minimum 210 at a given resonant circuit capacitance (or resonant frequency) and a maximum 212 at another resonant circuit capacitance (or resonant frequency). These resonances are so close to each other, that when existing systems were tuned for the minimum wafer surface voltage 210, slight variations in a resonant frequency of the resonant circuit were causing the wafer surface voltage to jump to the maximum 212. This explained the instability seen in existing systems. Said another way, a slight inaccuracy in the resonant circuit resonant frequency can lead to amplification rather than reduction of the cross coupled RF field, which results in an amplified DC voltage on the substrate surface due to rectification of the RF field in the plasma sheath. Additionally, even slight changes in processing conditions (e.g., gas pressure or plasma density, to name two) can shift the curve of FIG. 2 and also cause the resonant circuit to amplify the cross coupled RF field to the maximum 212, even where the resonant circuit was tuned for a minimum a moment earlier. Thus, a method was needed to accurately tune the resonant circuit to reliably and consistently operate at the minimum 210 and avoid the maximum 212.

It was also desirable to have a method that could tune the resonant circuit in real time. Existing tuning methods are slow and therefore cannot be performed in real-time. While tuning may seem a trivial task in light of FIG. 2, tuning is anything but trivial since FIG. 2 is not available in real-time, but rather is based on a model rather than measurements of the system. This is because sensors typically cannot be coupled directly to the substrate or substrate electrode due to space constraints in the chamber as well as due to interference with processing. Thus, existing methods either measure voltage between the resonant circuit and the substrate electrode or run multiple processes given different resonant frequencies of the resonant circuit, measure the results of processing on the different substrates, and then extrapolate the wafer surface voltage 202. However, measuring voltage between the resonant circuit and the substrate electrode does not give accurate wafer surface voltage 202 measurements. Similarly, empirical analysis of multiple process runs is time-consuming, wastes substrates and processing gases, and clearly does not provide a real-time measurement scheme for a given processing run. Further, this method does not allow adjustments to be made for changes in processing conditions during a single run. Thus, existing methods do not provide accurate real-time tuning of the resonant circuit in order to minimize cross-coupling of the RF power to the substrate.

FIG. 1 illustrates one embodiment of a plasma processing system able to reduce a DC bias on a substrate surface below a minimum otherwise set by RF coupling to the substrate. The system 100 includes a processing chamber 102 including a first electrode 104 and a second electrode 106. The first electrode 104 receives power from an RF source 112 (e.g., >100 KHz), and an electric field formed between the first and second electrodes 104, 106 from application of the RF power can ignite and sustain a plasma 110. The second electrode 106 can be optionally DC biased via an optional DC bias circuit 116. A wafer or substrate 108 rests atop or is coupled to the second electrode (or substrate electrode) 106 and has a surface 109 having a wafer surface potential $V_1$. An amplitude and frequency of the RF source 112 at least partially controls a density of the plasma 110 (or the "plasma 110 density"). A DC bias voltage from the optional DC bias circuit 116 can at least partially control the wafer surface potential $V_1$ and hence an ion energy of the plasma 110 (by "partially control" it is meant that regardless of the DC bias from the DC bias circuit 116, the bias cannot be set lower than a minimum established by RF cross-coupling, unless tuning of the resonant circuit 114 is implemented as described below).

A resonant circuit 114 (e.g., an LC circuit) can be arranged between the second electrode 106 and ground and in parallel to the optional DC bias circuit 116. The resonant circuit 114 can include a filter element, such as a variable capacitor, where the filter element can be tuned in order to reduce the wafer surface potential $V_1$ (e.g., tuning along the x-axis of FIG. 2).

The resonant circuit 114, if tuned correctly, can minimize RF coupling from the RF source 112 to the second electrode 106 and the substrate 108 (e.g., by tuning to the minimum wafer surface voltage 210 in FIG. 2). However, the resonant circuit 114 also creates a second resonance (e.g., the maximum wafer surface voltage 212 in FIG. 2) that occurs at a resonant circuit 114 setting that is only slightly different from that required to minimize coupling, and if this second resonance is encountered, the coupling is amplified.

Tuning the resonant circuit 114 might be simple if the wafer surface potential $V_1$ could be directly measured, and hence FIG. 2 could be recreated during processing, but as noted above, measuring $V_1$ directly is not possible. Therefore, this disclosure proposes to overcome these challenges via remote or non-invasive indirect measurement of $V_1$. In particular, an RF field level sensor 122 (e.g., an RF antenna) can capacitively or inductively detect an RF field level or voltage near the wafer surface 109, and while this only indicates a relative wafer surface voltage, monitoring relative changes in the RF voltage can be used to tune the resonant circuit 114 in order to operate at the minimum 210. This is possible because the RF voltage is rectified by the plasma sheath resulting in a proportional DC bias on the substrate surface 109.

The optional DC bias circuit 116 can, in an embodiment, include an RF power source and can provide RF power to the second electrode 106. The RF power may be rectified by the substrate and result in a DC bias on the substrate surface 109.

The RF field level sensor 122 can monitor electrical or magnetic fields, both of which are created at harmonics of the primary frequency of the RF source 112.

FIG. 3 illustrates a modeled wafer surface voltage 302 and an RF field level 306 measured by an RF field level sensor such as the RF field level sensor 122, where the RF field level has been filtered for the fundamental frequency of an RF source such as the RF source 112. The plot 300 can also include a measurement of current 304 filtered for the fundamental frequency of the RF source. As seen, for both measured RF field level 306 and measured current 304, there is no apparent correlation to the minimum wafer surface voltage 310, and hence apparently little useful information for tuning.

The inventors recognized that the RF field level sensor 122 is largely reading the RF field level from the first electrode 104 and thus filtering on the fundamental frequency does not provide much information about fields at the second electrode 108 (e.g., the wafer surface voltage $V_1$). However, the RF field is rectified by the sheath, which acts like a diode—passing current in one direction but not in the other—and thereby produces harmonics. These harmonics can be monitored as a way to look at the field occurring at the wafer surface. This is because the harmonics are primarily produced at the plasma sheath and primarily at the wafer surface voltage $V_1$, whereas the fundamental frequency is sourced from the first electrode. Therefore, by filtering for harmonics of the RF field level, an indirect means of tracking the minimum 310 (see e.g., FIG. 4) is enabled.

FIG. 4 illustrates a modeled wafer surface voltage 402 and a measured RF field level 408 measured by an RF field level sensor, such as the RF field level sensor 122, and filtered for a harmonic of a primary frequency of an RF source such as the RF source 112. The measured RF field level 408 can be seen to include a minimum 411 that corresponds to the minimum 410 of the wafer surface voltage 402. By "corresponds" it is meant that both minimums occur at substantially the same resonant frequency of the resonant circuit. Because of this correlation, remote measurements of the RF field level 408 at a harmonic of the primary frequency of the RF source 112 can be used for real-time tuning of the resonant circuit 114 so as to achieve the minimum 410 and thereby achieve lower ion energies than is possible without such tuning means.

Various tuning schemes can be used to tune to the minimum 410. For instance, the resonant circuit 114 can be tuned based on an algorithm that adjusts a capacitance of the resonant circuit in order to minimize the measured RF field level 408 at a harmonic of the RF source 112, which will correspondingly result in a wafer surface voltage 402 at the minimum 410. More particularly, where the resonant circuit 114 includes a variable capacitor, the variable capacitor can be tuned in order to minimize the measured RF field level 408 measured at a harmonic of the fundamental.

Second, third, fourth, and other harmonics can be used since all harmonics are primarily created via rectification of the RF field, and thus correspond to the wafer surface voltage. For instance, if the RF source 112 projects 40 MHz power into the plasma 110, then remote voltage measurements at 80 MHz (second harmonic) or 120 MHz (third harmonic) can be used.

Turning back to FIG. 1, the system 100 further can include an optional harmonics filter 117 coupled between the RF field level sensor 122 and the surface voltage minimum tracker 120. The optional harmonics filter 117 can filter measurements from the RF field level sensor 122 and thereby preclude all but a select range of frequencies from being provided to the surface voltage minimum tracker 120. In an embodiment, the harmonics filter 117 precludes all but a first, second, third, fourth, or other harmonic of the fundamental frequency of the RF source 112 from being provided to the surface voltage minimum tracker 120. In another embodiment, the harmonics filter 117 precludes all but two or more harmonics of the fundamental frequency of the RF source 112 from being provided to the surface voltage minimum tracker 120. In some cases, the harmonics filter 117 can discard unpassed frequencies, while in others all frequencies can be buffered in a memory and only select frequencies are passed to the surface voltage minimum tracker 120. The harmonics filter 117 can be coupled to the RF source 112, or a controller thereof, via a wired or wireless connection, so that an RF source 112 primary frequency or setpoint can be passed to the harmonics filter 117. Alternatively, a user can input the primary frequency to the harmonics filter 117 in order to avoid a coupling to the RF source 112 or a controller thereof. In some instances, the harmonics filter 117 can comprise an analogue filter and in other cases a digital filter can be used. The harmonics filter 117 can be discrete from or integrated with the RF field level sensor 122.

In some embodiments, the optional harmonics filter 117 can be integral with the RF field level sensor 122. In other words, the RF field level sensor 122 can inherently filter certain frequencies and thus the sensor 122 can be selected based on its filtering characteristics.

A surface voltage minimum tracker 120 (the "tracker") can be coupled between the optional harmonics filter 117 and a resonant circuit controller 118 (or between the RF field level sensor 122 and the resonant circuit controller 118). The tracker 120 can receive measurements of one or more harmonics of measurements from the RF field level sensor 122 and can provide instructions to the resonant circuit controller 118 that controls the resonant circuit 114 (e.g., by instructing the resonant circuit 114 to adjust a variable capacitor of the resonant circuit 114).

The tracker 120 can log the resonant circuit 114 settings (e.g., capacitance) and the measured RF field levels for harmonics detected by the RF field level sensor 122, and determine whether the measured RF field level 408 is approaching or moving away from the minimum 410. Alternatively, the tracker 120 can merely log whether a previous instruction to the resonant circuit controller 118 was to increase or decrease a resonant frequency of the resonant circuit 114. Alternatively, the tracker 120 can log whether a previous instruction to the resonant circuit controller 118 was to increase or decrease a resonant frequency of the resonant circuit 114 as well as a previous sample of a harmonic of the RF field level from the RF field level sensor 122. If approaching the minimum 410, then the tracker 120 can instruct the resonant circuit controller 118 to continue adjusting the resonant circuit 114 in a same manner as a previous adjustment until a harmonic of the RF field level 408 indicates that the harmonic of the RF field level 408 is moving away from the minimum 410 (e.g., when the harmonic of the RF field level 408 begins to rise after a period of decreasing values). If the harmonic of the RF field level 408 is moving away from the minimum 410, then the tracker 120 can instruct the resonant circuit controller 118 to adjust the resonant circuit 114 in an opposite manner.

The tracker 120 can further tune the resonant circuit 114 when changes in processing parameters cause the wafer surface voltage 402 to move off the minimum 410. In this way, the system 100 not only enables real-time tuning of the resonant circuit 114 without invasive measurements, but also enables continued tuning of the resonant circuit 114 during processing in order to keep RF coupling to a minimum in real-time.

The resonant circuit controller 118 (the "controller") can be coupled between the surface voltage minimum tracker 120 and the resonant circuit 114. The controller 118 can receive instructions from the surface voltage minimum tracker 120 and convert these to instructions for the resonant circuit 114. In some instances the tracker 120 determines whether a resonant frequency of the resonant circuit 114 should be increased or decreased and the controller 118 determines by how much the resonant frequency should be changed and instructs the resonant circuit 114 accordingly. In other instances, the tracker 120 determines which direction the resonant frequency should be adjusted and by how much, and the controller 118 merely passes corresponding instructions to the resonant circuit 114.

When the optional DC bias circuit 116 is implemented, this circuit alone can cause the wafer surface voltage 402 to move off of the minimum 410 and even jump to the maximum 412. However, like other system perturbations, tuning based on measurements of RF field level 408 at harmonics of the fundamental frequency of the RF source 412 can be used to tune in real-time to mitigate changes in the wafer surface voltage 402 caused by the DC bias circuit 116.

Accordingly, this disclosure describes systems and methods to provide real-time, accurate, non-invasive, and stable approximations of a substrate surface voltage, $V_1$, so that a resonant circuit can be tuned to minimize cross-coupling of RF power to the substrate and thereby minimize a DC bias on the substrate surface.

FIG. 5 illustrates an embodiment of a plasma processing system operating at multiple frequencies. The system 500 includes a processing chamber 502 including a first electrode 504 and a second electrode 506 (or substrate electrode). A first RF source 512 provides RF power to a plasma 510 via the first electrode 504 at a first primary frequency and a second RF source 513 provides RF power to the plasma 510 at a second primary frequency. The power from these two RF sources 512, 513 ignites and sustains the plasma 510, which performs processing on a substrate 508 having a substrate surface 509 at a wafer surface potential $V_1$. The second electrode 506 can optionally be biased via an optional DC bias circuit 516, and an amplitude of a DC bias from the optional DC bias circuit 516 can at least partially control the wafer surface potential $V_1$ and hence an ion energy of the plasma 510. However, even where the optional DC bias circuit 516 is implemented, a lower limit on the bias of the wafer surface potential, $V_1$, may be limited by cross coupling of the RF power from the first electrode 504 into the substrate 508. The cross-coupled RF power is rectified by the plasma 510 sheath and is seen as a DC voltage on the substrate surface 509. Additionally, amplitudes and frequencies of the RF sources 512, 513 at least partially control a density of the plasma 510 (or plasma density).

Because RF power is sourced at two different frequencies, a first resonant circuit 514 and a second resonant circuit 515 can be arranged between the second electrode 508 and ground, and in parallel with the optional DC bias circuit 516, and each resonant circuit 514, 515 can be tuned so as to dampen a cross coupled RF field level at a primary frequency of one of the two RF sources 512, 513. An RF field level sensor 522 can monitor RF field levels near the substrate surface 509, but without touching the substrate 508 or second electrode 506, and a harmonics filter 517 can filter the measurements thereby precluding all but specific harmonics of the primary frequencies of the first and second RF sources 512, 513 from reaching a surface voltage minimum tracker 520. The harmonics filter 517 can be coupled to the first and second RF sources 512, 513 such that the harmonics filter 517 can receive the two different frequencies that the first and second RF sources 512, 513 operate at. In some instances, the harmonics filter 517 can comprise an analogue filter and in other cases a digital filter can be used. The harmonics filter 517 can be discrete from or integrated with the RF field level sensor 522.

These harmonics can be provided to a surface voltage minimum tracker 520 (or "tracker"), which can then determine whether each of the resonant circuits 514, 515 should be tuned to a higher frequency or a lower frequency. In some cases both resonant circuits 514, 515 may be tuned in the same direction, in others they may be tuned in different directions, and in some cases one may remain at a given resonant frequency while the other continues to be tuned. Further the rate of tuning for each of the resonant circuits 514, 515 may vary or be the same. Based on this determination, the tracker 520 can instruct a resonant circuit controller 518 (the "controller") to instruct the resonant circuits 514, 515 to adjust their resonant frequencies based on these instructions. After initial filtering, the RF field level sensor 522, tracker 520, resonant circuit controller 518, and resonant circuits 514, 515 can continue to operate so as to account for any changes indirectly sensed in the wafer surface voltage $V_1$, and thereby maintain minimized cross coupling throughout a processing run (e.g., if processing conditions, such as gas pressure in the chamber or other conditions, change).

While FIG. 5 shows two separate resonant circuits 514, 515, in another embodiment, a single resonant circuit is able to minimize cross coupling from two different RF sources 514, 515 operating at different frequencies or from a single RF source generating two different primary RF frequencies. In yet a further embodiment, where a single RF source producing power at two or more different frequencies is used, a single resonant circuit able to minimize cross coupling at two different frequencies, and tuned to do the same, can be used.

In some embodiments, the optional harmonics filter 517 can be integral with the RF field level sensor 522. In other words, the RF field level sensor 522 can inherently filter certain frequencies and thus the sensor 522 can be selected based on its filtering characteristics.

While only embodiments of one and two RF sources and one and two resonant circuits have been illustrated, one of skill in the art will recognize that three or more different primary frequencies of power can be implemented along with a corresponding number of resonant circuits, or a resonant circuit able to dampen cross-coupling at those three or more different primary frequencies. One of skill in the art will also recognize that the RF sources 112, 512, 513 can capacitively or inductively couple to the second electrode 106, 506. Either way, there is always some portion of capacitive coupling. As such, the systems and methods disclosed herein minimize this capacitive coupling regardless as to whether the primary coupling is inductive or capacitive.

Those of skill in the art will recognize that the RF field level sensor 122, 522 measure a relative RF field level. While the relative RF field level is related to, and indicates changes in, an absolute wafer surface voltage, $V_1$, it does not provide an absolute voltage measurement. Nor does it need to, since the measurement is primarily used to track a minimum; only increases or decreases in RF field level need be measured. As a result, the RF field level sensor 122, 522 need not be calibrated, enabling less expensive sensors to be used.

In the alternative, use of a calibrated sensor in conjunction with the RF field level sensor 122, 522, enables the RF field level sensor 122, 522 to measure an absolute RF field level and hence an absolute rectified DC bias on the substrate 509 (e.g., the wafer surface voltage $V_1$ when the DC bias circuit 516 is either not used or is not providing a DC bias).

In other embodiments, alternative circuits to the illustrated resonant (or filter) circuit 114, 514, 515 can be implemented using the same control scheme. In each alternative case, a harmonic of the RF field level at or near the substrate surface can be measured and used to control a resonant frequency of a resonant circuit (or filter circuit) so that the indirectly measured wafer surface voltage $V_1$ remains at or near a minimum.

The optional DC bias circuit 516 can, in an embodiment, include an RF power source and can provide RF power to the second electrode 506. The RF power may be rectified by the substrate and result in a DC bias on the substrate surface 509.

FIG. 6 illustrates a method of minimizing an ion energy floor created by parasitic coupling of RF power from an RF source electrode into an electrode that the substrate is coupled to. The method 600 includes indirect monitoring of an RF field level at a surface of a substrate in a plasma processing chamber (Block 602). Indirectly can include monitoring from within the plasma processing chamber, but without touching the substrate or electrode that is coupled to the substrate. A harmonics filter or other component can then filter measurements of the RF field level from the monitoring, where the filtering is performed for a select one or more harmonics of a primary frequency of an RF source (Block 604). The method 600 can then adjust a resonant frequency of a resonant circuit (e.g., an LC circuit) to minimize the harmonics of the RF field level measured near a surface of the substrate (Block 606).

Via the method 600, an optional DC bias can be applied to the substrate, for instance in parallel with the resonant circuit, that can partially control a DC bias on the substrate surface. Due to tuning of the resonant circuit, the DC bias on the substrate surface effected by both cross-coupling of RF power from the RF source as well as the optional DC bias, can be lower than a minimum DC bias achievable where tuning of the resonant circuit is not used.

Filtering can be performed by a harmonics filter such as an analogue or digital filter. The filter can be incorporated into an RF field level sensor or can receive measurements from a sensor and preclude certain of the measurements from passing through the filter.

In some cases adjusting the resonant frequency can include adjusting a capacitive or inductive component of the resonant circuit, for instance adjusting a variable capacitor. In some cases adjusting the resonant frequency includes adjusting a capacitance of the resonant circuit.

While the method 600 has been described relative to a single primary frequency of an RF source, in other embodiments, multiple primary frequencies can be implemented and the filter and control of the resonant circuit can account for these multiple primary frequencies. In some cases multiple RF sources can be used, each providing a different primary RF frequency to the plasma. At the same time, multiple resonant circuits can be used and each can be tuned in order to dampen cross-coupling from a different primary RF frequency.

The adjustment to the resonant frequency can be based on analysis of a single previous measurement of a harmonic of the fundamental frequency of the RF field level near the substrate surface, or based on multiple previous measurements thereof, for instance an average of previous harmonics measurements. The direction and amplitude of these adjustments can be tailored to minimize the one or more harmonics and in some cases can be tailored to minimize the one or more harmonics in the shortest time possible and/or with the greatest accuracy.

In some instances, a combination of information from one or more harmonics as well as the primary frequency of the RF source can be used to more effectively tune for a minimum of the wafer surface voltage. Further, it is noted that a harmonic of the fundamental is linearly related to the RF cross-coupled potential on the substrate surface, and therefore the one or more harmonics could yield information beyond merely that used to tune for the minimum wafer surface voltage. This information could also be used to infer an actual potential on the wafer surface, for instance.

The systems and methods described herein can be implemented in a computer system in addition to the specific physical devices described herein. FIG. 7 shows a diagrammatic representation of one embodiment of a computer system 700 within which a set of instructions can execute for causing a device to perform or execute any one or more of the aspects and/or methodologies of the present disclosure. The surface voltage minimum tracker 120, resonant circuit controller 118, and the harmonics filter 117, in FIG. 1, could each together or independently be part of a computing system exemplifying one implementation of the computer system 700. The components in FIG. 7 are examples only and do not limit the scope of use or functionality of any hardware, software, firmware, embedded logic component, or a combination of two or more such components implementing particular embodiments of this disclosure. Some or all of the illustrated components can be part of the computer system 700. For instance, the computer system 700 can be a general purpose computer (e.g., a laptop computer) or an embedded logic device (e.g., an FPGA), to name just two non-limiting examples.

Computer system 700 includes at least a processor 701 such as a central processing unit (CPU) or an FPGA to name two non-limiting examples. The surface voltage minimum tracker 120 in FIG. 1 is one component that may include or may be part of a processor such as processor 701. The computer system 700 may also comprise a memory 703 and a storage 708, both communicating with each other, and with other components, via a bus 740. The bus 740 may also link a display 732, one or more input devices 733 (which may, for example, include a keypad, a keyboard, a mouse, a stylus, etc.), one or more output devices 734, one or more storage devices 735, and various non-transitory, tangible computer-readable storage media 736 with each other and with one or more of the processor 701, the memory 703, and the storage 708. All of these elements may interface directly or via one or more interfaces or adaptors to the bus 740. For instance, the various non-transitory, tangible computer-readable storage media 736 can interface with the bus 740 via storage medium interface 726. Computer system 700 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 701 (or central processing unit(s) (CPU(s))) optionally contains a cache memory unit 702 for temporary local storage of instructions, data, or computer addresses. Processor(s) 701 are configured to assist in execution of computer-readable instructions stored on at least one non-transitory, tangible computer-readable storage medium. Computer system 700 may provide functionality as a result of the processor(s) 701 executing software embodied in one or more non-transitory, tangible computer-readable storage media, such as memory 703, storage 708, storage devices 735, and/or storage medium 736 (e.g., read only memory (ROM)). For instance, the method 600 in FIG. 6 may be embodied in one or more non-transitory, tangible computer-readable storage media. The non-transitory, tangible computer-readable storage media may store software that implements particular embodiments, such as the method 600, and processor(s) 701 may execute the software. Memory 703 may read the software from one or more other non-transitory, tangible computer-readable storage media (such as mass storage device(s) 735, 736) or from one or more other sources through a suitable interface, such as network interface 720. The software may cause processor(s) 701 to carry out one or more processes or one or more steps of one or more processes described or illustrated herein. Carrying out such processes or steps may include defining data structures stored in memory 703 and modifying the data structures as directed by the software. In some embodiments, an FPGA can store instructions for carrying out functionality as described in this disclosure (e.g., the method 600). In other embodiments, firmware includes instructions for carrying out functionality as described in this disclosure (e.g., the method 600).

The memory 703 may include various components (e.g., non-transitory, tangible computer-readable storage media) including, but not limited to, a random access memory component (e.g., RAM 704) (e.g., a static RAM "SRAM", a dynamic RAM "DRAM, etc.), a read-only component (e.g., ROM 705), and any combinations thereof. ROM 705 may act to communicate data and instructions unidirectionally to processor(s) 701, and RAM 704 may act to communicate data and instructions bidirectionally with processor(s) 701. ROM 705 and RAM 704 may include any suitable non-transitory, tangible computer-readable storage media described below. In some instances, ROM 705 and RAM 704 include non-transitory, tangible computer-readable storage media for carrying out the method 600. In one example, a basic input/output system 706 (BIOS), including basic routines that help to transfer information between elements within computer system 700, such as during start-up, may be stored in the memory 703.

Fixed storage 708 is connected bidirectionally to processor(s) 701, optionally through storage control unit 707. Fixed storage 708 provides additional data storage capacity and may also include any suitable non-transitory, tangible computer-readable media described herein. Storage 708 may be used to store operating system 709, EXECs 710 (executables), data 711, API applications 712 (application programs), and the like. For instance, the storage 708 could be implemented for storage of a primary or fundamental frequency of the RF source 112, in FIG. 1, or for setpoints of the resonant circuit 114 as in FIG. 1. Often, although not always, storage 708 is a secondary storage medium (such as a hard disk) that is slower than primary storage (e.g., memory 703). Storage 708 can also include an optical disk drive, a solid-state memory device (e.g., flash-based systems), or a combination of any of the above. Information in storage 708 may, in appropriate cases, be incorporated as virtual memory in memory 703.

In one example, storage device(s) 735 may be removably interfaced with computer system 700 (e.g., via an external port connector (not shown)) via a storage device interface 725. Particularly, storage device(s) 735 and an associated machine-readable medium may provide nonvolatile and/or volatile storage of machine-readable instructions, data structures, program modules, and/or other data for the computer system 700. In one example, software may reside, completely or partially, within a machine-readable medium on storage device(s) 735. In another example, software may reside, completely or partially, within processor(s) 701.

Bus 740 connects a wide variety of subsystems. Herein, reference to a bus may encompass one or more digital signal lines serving a common function, where appropriate. Bus 740 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 700 may also include an input device 733. In one example, a user of computer system 700 may enter commands and/or other information into computer system 700 via input device(s) 733. Examples of an input device(s) 733 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 733 may be interfaced to bus 740 via any of a variety of input interfaces 723 (e.g., input interface 723) including, but not limited to, serial, parallel, game port, USB, FIREWIRE, THUNDERBOLT, or any combination of the above.

In particular embodiments, when computer system 700 is connected to network 730, computer system 700 may communicate with other devices, such as mobile devices and enterprise systems, connected to network 730. Communications to and from computer system 700 may be sent through network interface 720. For example, network interface 720 may receive incoming communications (such as requests or responses from other devices) in the form of one or more packets (such as Internet Protocol (IP) packets) from network 730, and computer system 700 may store the incoming communications in memory 703 for processing. Computer system 700 may similarly store outgoing communications (such as requests or responses to other devices) in the form of one or more packets in memory 703 and communicated to network 730 from network interface 720. Processor(s) 701 may access these communication packets stored in memory 703 for processing.

Examples of the network interface 720 include, but are not limited to, a network interface card, a modem, and any combination thereof. Examples of a network 730 or network segment 730 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 730, may employ a wired and/or a wireless mode of communication. In general, any network topology may be used.

Information and data can be displayed through a display 732. Examples of a display 732 include, but are not limited to, a liquid crystal display (LCD), an organic liquid crystal display (OLED), a cathode ray tube (CRT), a plasma display, and any combinations thereof. The display 732 can interface to the processor(s) 701, memory 703, and fixed storage 708, as well as other devices, such as input device(s) 733, via the bus 740. The display 732 is linked to the bus 740 via a video interface 722, and transport of data between the display 732 and the bus 740 can be controlled via the graphics control 721.

In addition to a display 732, computer system 700 may include one or more other peripheral output devices 734 including, but not limited to, an audio speaker, a printer, and any combinations thereof. Such peripheral output devices may be connected to the bus 740 via an output interface 724. Examples of an output interface 724 include, but are not limited to, a serial port, a parallel connection, a USB port, a FIREWIRE port, a THUNDERBOLT port, and any combinations thereof.

In addition or as an alternative, computer system 700 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a non-transitory, tangible computer-readable medium may encompass a circuit (such as an IC) storing software for execution, a circuit embodying logic for execution, or both, where appropriate. The present disclosure encompasses any suitable combination of hardware, software, or both.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Within this specification, the same reference characters are used to refer to terminals, signal lines, wires, etc. and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, or microcontroller. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein (e.g., the method 600) may be embodied directly in hardware, in a software module executed by a processor, a software module implemented as digital logic devices, or in a combination of these. A software module may reside in RAM memory, flash memory, ROM memory, EPROM memory, EEPROM memory, registers, hard disk, a removable disk, a CD-ROM, or any other form of non-transitory, tangible computer-readable storage medium known in the art. An exemplary non-transitory, tangible computer-readable storage medium is coupled to the processor such that the processor can read information from, and write information to, the non-transitory, tangible computer-readable storage medium. In the alternative, the non-transitory, tangible computer-readable storage medium may be integral to the processor. The processor and the non-transitory, tangible computer-readable storage medium may reside in an ASIC. The ASIC may reside in a user terminal. In the alternative, the processor and the non-transitory, tangible computer-readable storage medium may reside as discrete components in a user terminal. In some embodiments, a software module may be implemented as digital logic components such as those in an FPGA once programmed with the software module.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The various components described herein for controlling a resonant circuit can be part of one or more separate systems coupled to but structurally independent from the plasma processing chamber 102. In some cases these components can also be separate from or integrated with a power system of the plasma processing chamber 102, for instance separate from or integrated with the RF source 112. In other embodiments, these components as well as the resonant circuit 114, and optionally the DC bias circuit 116 can be integrated with a power system including, for instance, an RF source 112. Various other combinations of integrations and separations between components in this disclosure are also envisioned and such variations do not depart from the scope or spirit of this disclosure.

For the purposes of this disclosure, a "field level" as compared to a voltage or a current, is a relative measurement made without a reference (e.g., a floating measurement). In other words, a field level does not correspond to any particular voltage or current. However, a change in RF field level does correspond to a change in a voltage or current.

To summarize, this disclosure discusses systems, methods, and apparatus that can indirectly determine in real-time, and non-intrusively, a substrate surface voltage by measuring an RF field level at harmonics of a fundamental frequency of an RF source. The RF source can include one or more frequencies and an RF field level sensor can monitor field levels near the substrate surface and tuning circuitry can filter the monitored levels for each of these frequencies. The measurements can be used to tune one or more resonant circuits that in turn minimize cross coupling of the RF field to a substrate and thereby minimize a portion of DC bias on the substrate attributable to cross coupling. An inexpensive non-calibrated sensor can be used to make the measurements, although with a calibrated sensor, absolute substrate surface potential can be measured.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system for reducing a DC voltage on a substrate of a plasma processing chamber below a minimum otherwise established by cross-coupling from an RF power source, the system comprising:
    an RF field level sensor configured to be arranged adjacent to, but not touching, a substrate being processed in the plasma processing chamber;
    a harmonics filter configured to:
        couple to one or more RF power sources for a plasma processing chamber;
        receive a primary RF frequency from the one or more RF power sources;
        receive RF field level measurements from the RF field level sensor; and
        preclude the passage of measurements of at least the primary RF frequency;
    a first tunable resonant circuit configured to couple between the substrate and ground;
    a surface voltage minimum tracker coupled to the harmonics filter and configured to:
        receive measurements from the harmonics filter other than those of at least the primary RF frequency; and
        determine whether the first resonant circuit is to be tuned to a higher or lower resonant frequency in order to minimize the measurements from the harmonics filter; and
    a controller circuit coupled between the surface voltage minimum tracker and the first resonant circuit and configured to generate one or more control signals to increase or decrease a first resonant frequency of the first resonant circuit based on instructions from the surface voltage minimum tracker.

2. The system of claim 1, wherein the first resonant circuit is an LC circuit.

3. The system of claim 2, wherein the LC circuit has a variable capacitor.

4. The system of claim 1, further comprising a DC bias circuit in parallel with the first resonant circuit.

5. The system of claim 1, wherein the harmonics filter precludes the passage of measurements from all but a second harmonic of the primary RF frequency.

6. The system of claim 1, wherein a minimum of the measurements from the harmonics filter corresponds to a minimum of the DC voltage on the substrate surface.

7. The system of claim 1, wherein the harmonics filter is further configured to:
receive two or more primary frequencies from the one or more RF power sources;
preclude the passage of measurements of at least the two or more primary frequencies.

8. The system of claim 1, further comprising a second resonant circuit coupled in parallel with the first resonant circuit, and wherein the controller circuit is further configured to generate the one or more control signals to increase or decrease the first resonant frequency of the first resonant circuit and a second resonant frequency of the second resonant circuit based on instructions from the surface voltage minimum tracker.

9. A system for minimizing RF cross-coupling to a substrate in a dual-electrode plasma processing chamber, the system comprising:
a plasma processing chamber;
a first electrode;
a second electrode;
an RF source coupled to the first electrode and providing RF power to the first electrode at a first frequency, the RF power igniting and sustaining a plasma in the processing chamber;
a substrate coupled to the second electrode and having a DC surface voltage, where a minimum of the DC surface voltage is limited by cross coupling of the RF power to the substrate;
an RF field level sensor inside the plasma processing chamber measuring an RF field level near the substrate and passing measurements of the RF field level to a controller;
a first tunable resonant circuit coupled between the second electrode and ground; and
the controller coupled to the RF field level sensor and the first tunable resonant circuit, the controller tuning the first tunable resonant circuit based on the measurements of the RF field filtered at one or more harmonics of the first frequency so as to minimize the cross coupling of the RF power to the substrate.

10. The system of claim 9, further comprising:
a second RF source coupled to the first electrode and providing RF power to the first electrode at a second frequency; and
a second tunable resonant circuit coupled between the second electrode and ground and in parallel with the first tunable resonant circuit,
wherein the controller is further coupled to the second tunable resonant circuit, the controller further tuning the second tunable resonant circuit based on measurements from the RF field level sensor of the RF field filtered at a harmonic of the second frequency so as to minimize the cross coupling of the RF power to the substrate.

11. The system of claim 9, wherein the RF source provides power to the first electrode at a first and a second frequency, and wherein the system further comprises:
a second tunable resonant circuit coupled between the second electrode and ground and in parallel with the first tunable resonant circuit,
wherein the controller is further coupled to the second tunable resonant circuit, the controller further tuning the tunable resonant circuit based on measurements from the RF field level sensor of the RF field filtered at a harmonic of the second frequency so as to minimize the cross coupling of the RF power to the substrate.

12. The system of claim 9, further comprising:
a second RF source coupled to the first electrode and providing RF power to the first electrode at a second frequency; and
wherein the controller tunes the first tunable resonant circuit based on measurements from the RF field level sensor of the RF field filtered at a harmonic of the first frequency and at a harmonic of the second frequency so as to minimize the cross coupling of the RF power to the substrate.

13. The system of claim 9, further comprising a DC bias circuit coupled between the second electrode and ground and in parallel to the tunable resonant circuit, the DC bias circuit partially controlling the DC surface voltage on the substrate.

14. The system of claim 9, wherein the tunable resonant circuit includes a variable capacitor, and wherein adjusting the variable capacitor tunes the tunable resonant circuit.

15. The system of claim 9, wherein the controller tunes the tunable resonant circuit based on an algorithm that minimizes the RF field level near the substrate filtered for a harmonic of the first frequency.

16. The system of claim 9, wherein the first tunable resonant circuit is a tunable LC circuit.

17. The system of claim 9, wherein the RF field level sensor filters out the primary frequency of the RF power, thereby only passing one or more harmonics of the RF power.

18. A method for minimizing an ion energy floor created by parasitic coupling of RF power from an RF source electrode into an electrode that a substrate is coupled to, the method comprising:
monitoring, with an RF field level sensor inside a plasma processing chamber, an RF field level at a surface of a substrate without touching the surface;
filtering measurements of the RF field level for one or more harmonics of a primary frequency at which RF power is coupled into a plasma processing chamber comprising the substrate;
adjusting a resonant frequency of a first resonant circuit coupled between the substrate and ground in order to minimize the one or more harmonics.

19. The method of claim 18, wherein a minimum of the harmonics corresponds to a minimum of the ion energy.

20. The method of claim 18, further comprising applying a DC bias to the substrate via a DC bias circuit that controls a DC bias on a surface of the substrate, the DC bias being lower than a minimum DC bias achievable without the adjusting of the resonant frequency.

* * * * *